United States Patent [19]
Moran et al.

[11] Patent Number: 5,261,055
[45] Date of Patent: Nov. 9, 1993

[54] EXTERNALLY UPDATABLE ROM (EUROM)

[75] Inventors: Dov Moran, Ramat-Gan; Arie Mergui, Tel Aviv, both of Israel; Amir Friedman, Dix Hills, N.Y.

[73] Assignee: Milsys, Ltd., Ramat-Gan, Israel

[21] Appl. No.: 838,050

[22] Filed: Feb. 19, 1992

[51] Int. Cl.⁵ .............................................. G06F 13/00
[52] U.S. Cl. .................................................. 395/275
[58] Field of Search ............... 364/DIG. 1, DIG. 2; 395/275, 425, 775

[56] References Cited

U.S. PATENT DOCUMENTS

| | | |
|---|---|---|
| 4,116,518 | 9/1978 | Pleskac . |
| 4,116,519 | 9/1978 | Grabbe et al. . |
| 4,648,076 | 3/1987 | Schrenk . |
| 4,698,750 | 10/1987 | Wilkie et al. . |
| 4,720,812 | 1/1988 | Kao et al. ............................ 364/900 |
| 4,855,954 | 8/1989 | Turner et al. . |
| 4,879,688 | 11/1989 | Turner et al. . |
| 4,896,296 | 1/1990 | Turner et al. . |
| 4,970,692 | 11/1990 | Ali et al. . |
| 5,003,510 | 3/1991 | Kamisaki . |
| 5,155,833 | 10/1992 | Cullison et al. ..................... 395/425 |

Primary Examiner—Robert L. Richardson
Attorney, Agent, or Firm—Whitham & Marhoefer

[57] ABSTRACT

An electronically programmable read-only memory module has an embedded micro-controller for program/data updating.

Upon power up, the module acts as a prior art ROM. The embedded micro-controller in a standby mode is responsive to data arriving from a download communication interface that is accessible by an external port on the module. The external port and download communication interface is independent of the system of which the module is an operating component. When a command is received from the download communication interface, the micro-controller switches the memory device to respond to micro-controller inputs that starts an update session. The micro-controller receives download data from the download communication interface and writes it into the memory device. When the download process terminates, the micro-controller switches the memory device back to its system interface.

13 Claims, 4 Drawing Sheets

EXTERNALLY UPDATABLE ROM (EUROM)

BACKGROUND OF THE INVENTION

1. Field of the Invention

The present invention relates to electronically programmable read-only memories, and more particularly to memory with an embedded controller that allows the memory contents to be changed independently of, but without removal from, a system of which it is a component part.

2. Description of the Prior Art

Microprocessor-based systems and subsystems commonly employ a read-only memory (ROM) to store at least certain operating system routines. Within the last several years, new electronically programmable non-volatile memories have been developed and are in commercial use. These memories include various device technologies such as EEPROM, Flash, SRAM with battery backup or FRAM.

These new memory technologies offer a potential for in-system changes in the program stored in them. However, this potential has not been fully commercially realized because of the system overhead needed to take advantage of this potential.

SUMMARY OF THE INVENTION

An object of this invention is the provision of an electronically programmable, memory module that has an embedded controller to allow the contents of the memory to be altered independently of the system of which the module is a part and without removing the module from a system.

Briefly, the invention contemplates the provision of an electronically programmable read-only memory module with an embedded micro-controller (i.e., controller, processor, or control logic) for program/data updating.

Upon power up, the module acts as a prior art ROM. The embedded micro-controller in a standby mode is responsive to data arriving from a download communication interface that is accessible by an external port on the module. The external port and download communication interface is independent of the system of which the module is an operating component. When a command is received from the download communication interface, the micro-controller switches the memory device to respond to micro-controller inputs that starts an update session. The micro-controller receives download data from the download communication interface and writes it into the memory device. When the download process terminates, the micro-controller switches the memory device back to its system interface.

The memory device can be any standard memory component. Practically it should be non-volatile memory such as EEPROM, Flash memory, Static RAM with battery backup, Ferroelectric RAM, or any other non-volatile memory technology or implementation leading to non-volatile storage of data.

Switching logic specifies which channel accesses the memory. In normal system operation, the memory is accessed from the standard memory interface. When the module is in a memory update state, the memory device is accessed by the embedded micro-controller.

The embedded download communication interface can be any suitable interface to the outside world. It can be a wired interface, which requires additional pins or an embedded connector in the module package. It also can be a wireless interface such as an RF channel, infrared channel, or an optical channel.

One embodiment of the module incorporates pin sockets that allows insertion of an additional memory device on top of it. The additional memory device incorporates memory and decoding logic and may include pin sockets which will enable insertion of still another additional memory device.

The logic for programming a module with inserted add-on memories is the same as that without inserted modules. Therefore, an upgrade involves only stacking a memory device over the base module or over another memory upgrade device. The upgradeability feature allows combination of different types of memory technologies (e.g., CMOS, RAM and FLASH modules to be combined).

BRIEF DESCRIPTION OF THE DRAWINGS

The foregoing and other objects, aspects and advantages will be better understood from the following detailed description of a preferred embodiment of the invention with reference to the drawings where like reference numerals designate like components in the various figures, and in which.

DETAILED DESCRIPTION OF A PREFERRED EMBODIMENT OF THE INVENTION

Figure 1:
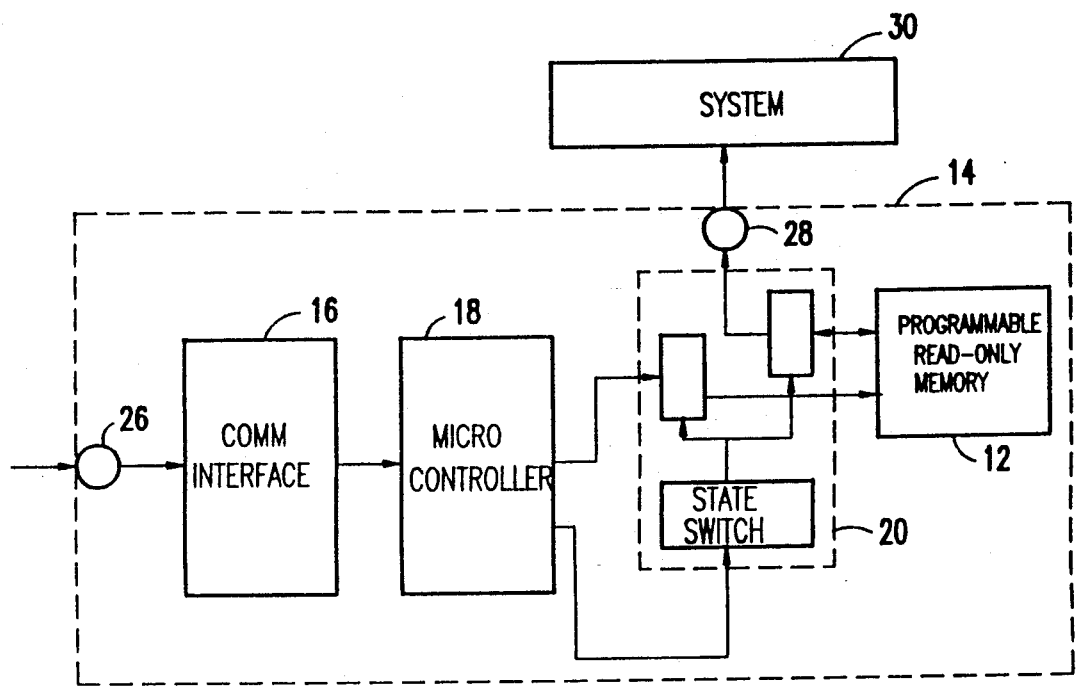
FIG. 1 is a block diagram of one embodiment of a programmable memory with an embedded controller in accordance with the teachings of this invention.

Referring now to FIG. 1, in this preferred embodiment of the invention a programmable memory device 12 is formed in a single semiconductor chip 14 indicated by the dotted rectangle. Chip 14 also has formed integrally therein a download communication interface 16, and a micro-controller 18 along with appropriate interconnections among the various components. Also formed in the chip 14 is a state switching logic 20. Program data to alter the contents of memory device 12 is coupled to a data input port 26, and in normal operation, the memory 12 is connected to a system 30 (of which the memory module is a component part), through a system input/output port 28. It will be appreciated by those skilled in the art that the memory module shown in FIG. 1 may be readily manufactured using well known semiconductor fabrication process steps such as those employed to manufacture very large-scale integrated circuits. For example, the module can be implemented by techniques such as, but not limited to, hybrids, large-scale silicon integration and packaged in plastic, ceramic, DIP, SIP, SOP, TSOP, TAB form, and in any standard or non-standard pin out.

The memory module 14 can be treated by a system designer as a regular memory component; it can have the same external pin-out (not shown), the same physical dimension and the same electrical interface characteristics.

Upon power up, the module acts as a prior art ROM. That is, upon the system being "turned on" the module 14 receives and responds to read commands from the system 30 in the same manner as any prior art read-only memory, including read-only memories that are not alterable. The embedded micro-controller 18 is in a standby mode, but is responsive to any data arriving from the download communication interface 16 coupled to port 26. The external port 26 is independent of the system 30 of which the module is an operating component. When a command is received via the download communication interface 16, the micro-controller 18 operates state switching logic 20 to switch the memory device 12 to respond to micro-controller inputs, and an update session is started. The micro-controller 18 receives download data from the download communication interface 16 and writes it into the memory device 12. When the download process terminates, the micro-controller switches the memory device back to system interface port 28.

Figure 2:
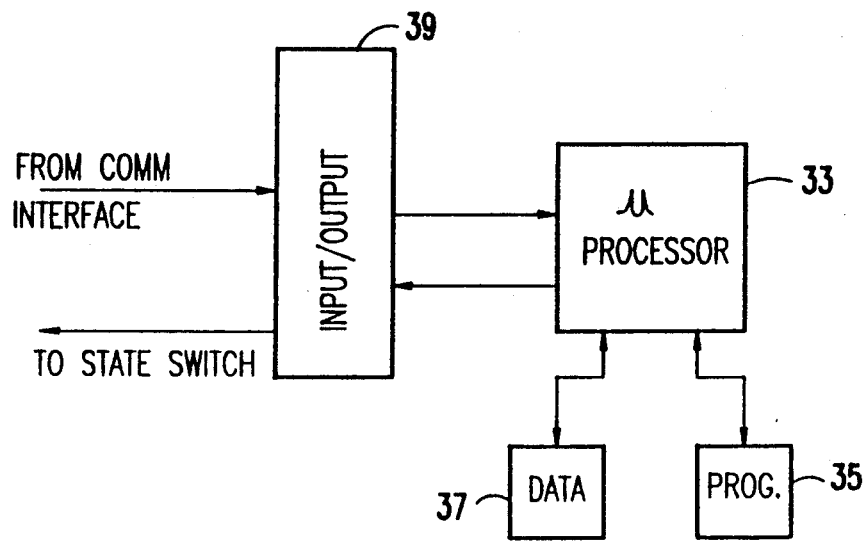
FIG. 2 is a block diagram of one embodiment of a embedded micro-controller suitable for the practice of this invention.

Referring now to FIG. 2, the embedded micro-controller 18 can be of any suitable design and will include a microprocessor 33 with its own stored operating system program memory 35, a data memory 37, and an I/O buffers and logic section 39. The micro-controller controls the interface to the external port 26, monitors the input lines, controls the state switching logic 20 and programs the memory 12 in accordance to data arriving from the external port 26.

The memory device 12 can be any standard memory component. Practically it should be non-volatile memory such as EEPROM, Flash memory, Static RAM with battery backup, Ferroelectric RAM, or any other non-volatile memory technology. The memory device 12 is accessed by the system 30 as a standard memory device. It has address lines which specify which address is accessed, and data lines which contain the data to be written into memory during write accesses and the read data during read from memory cycles. It has control lines for selecting the device for access and specifying access type, i.e., read or write, and it includes power lines, usually 5 V and sometimes 12 V, used during write cycles to the memory component or any other voltage required by the memory technology.

State switching logic 20 specifies which channel accesses the memory. In normal system operation, the memory is accessed from the standard memory interface port 28. When the module is in a memory update state, the memory device 12 is accessed by the embedded micro-controller 18, which also controls the state switching logic 20. Here it should be noted that, if desired, during a memory update session, the switching logic can be programmed to respond to a memory access from the standard memory interface 28 as either tri-state or any data value on the data lines.

The embedded download communication interface can be any suitable interface to the outside world. The communication interface can include a modem for connecting to communication lines, such as telephone lines. It can be a wired interface, which requires additional or multiplexed pins or an embedded connector in the module package. A typical wired interface would be a serial interface such as an RS-232 interface. The additional pins can be arranged by either extending the package size of a standard memory device, or by adding the pins on any side of the package, i.e., on top, bottom or one of the four package walls to allow a connection from the module to the "external world" with wires which will serve as communication lines. The communication interface can also can be a wireless interface such as an RF channel or an optical channel.

A wireless download interface allows an interface to the module without any wiring to the "external world". A module with wireless download interface can serve as a direct replacement to existing memory component, with no need for a system designer to change his or her design.

Figure 3:
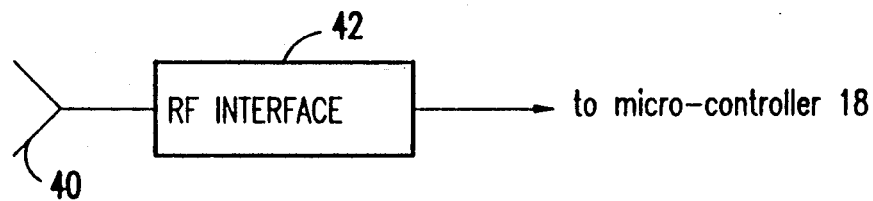
FIG. 3 is a block diagram of one embodiment of an embedded RF communication interface suitable for the practice of this invention.

A typical RF download communication interface is illustrated in FIG. 3. It includes an antenna 40 to receive the data and an RF to micro-controller interface of a suitable design known in the art appropriate to the transmitted RF signal.

In general, the download protocol can be any interface protocol. It can be uni-directional, bi-directional, full duplex or half duplex protocol. The protocol can be any standard protocol such as XMODEM, KERMIT, XON/XOFF, SCSI. It also can be a proprietary protocol specially designed for the module.

Figure 4:
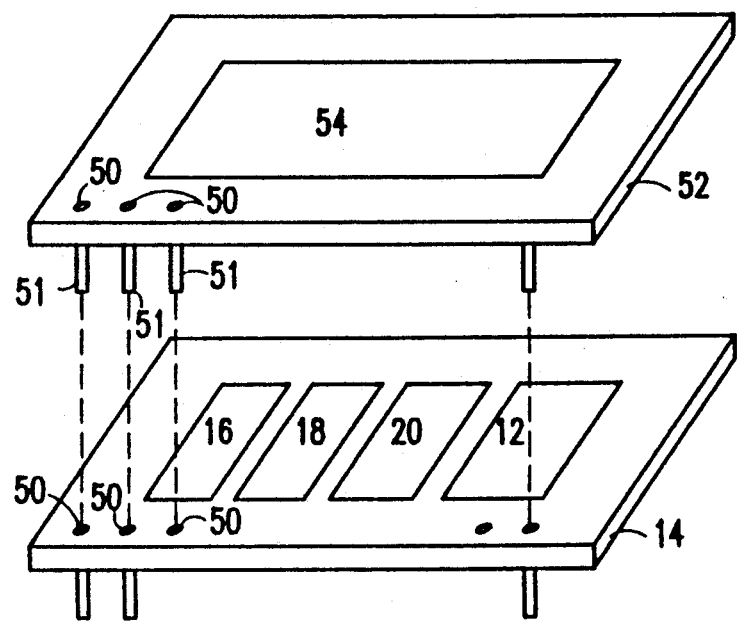
FIG. 4 is a perspective block diagram of an embodiment of the invention illustrating the memory upgradeability feature.
Figure 5:
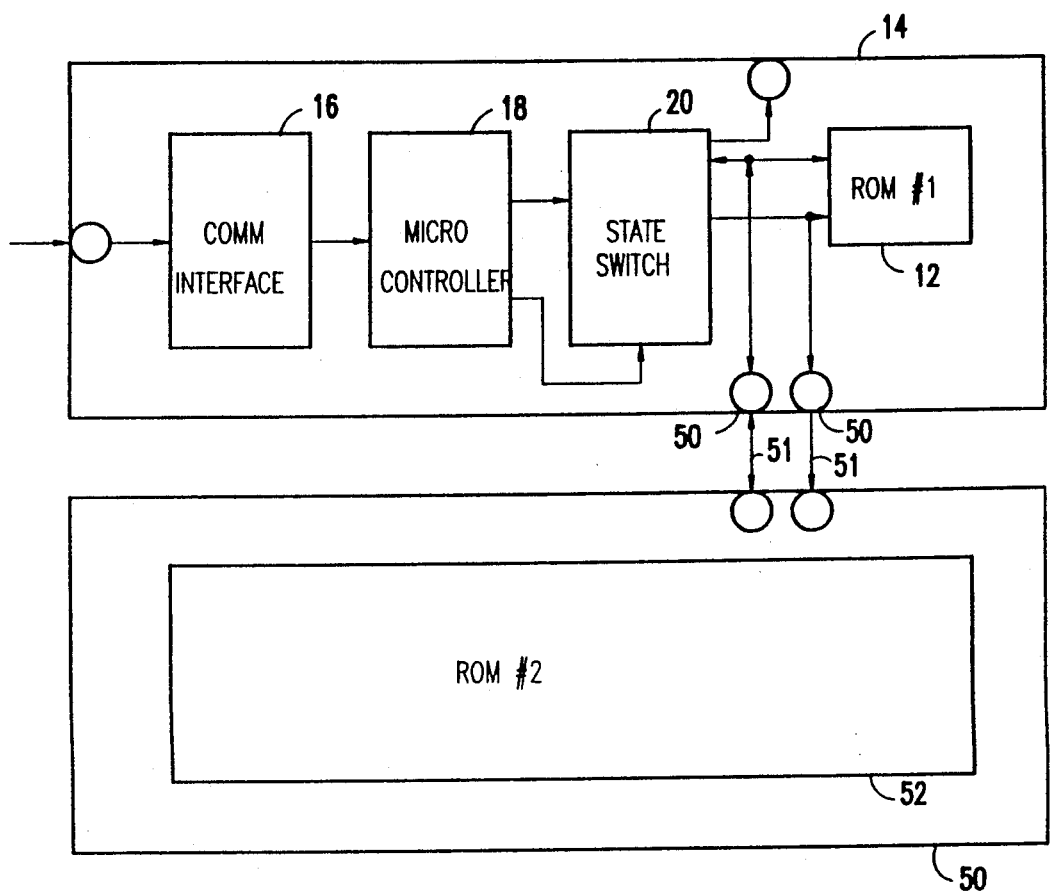
FIG. 5 is a block diagram illustrating the embodiment of the invention illustrated in FIG. 4.

Referring now to FIGS. 4 and 5, this embodiment of the invention incorporates pin sockets 50 that allows insertion of an additional memory device 52 on top of it by way of pins 51 on the module 50. The additional memory device incorporates memory and decoding logic 54 and may itself include pin sockets 50 which will enable insertion of an additional memory module.

The logic for programming a module 14 with inserted memories 52 is the same as that without additional memory. Therefore, an upgrade involves only stacking a memory module over the base module or over another memory upgrade module/modules. The upgradeability feature allows combination of different types of memory (e.g., CMOS, RAM and FLASH modules).

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. An electronically programmable memory module, comprising in combination:
   an electronically alterable memory device;
   a first data channel for coupling said memory device to a digital system in which said memory is a component part;
   a second data channel for coupling said memory device to a data input port that is accessible independently of said digital system;
   said second data channel including a communications interface, a controller, and a state switch controlled by said controller;
   said communications interface coupling data from said data input port to said controller;
   said controller switching said state switch to a first state in response to a data input at said data input port, and to a second state in the absence of a data input at said data input port;
   said state switch, in said first state, coupling said memory device to said controller and, in said second state, coupling said memory device to said first data channel;
   said controller executing a write operation in said electronically alterable memory device in accordance with input signals applied at said data input port of said second data channel so that said controller stores in said memory device data received from said communications interface independently of said digital system; and said controller executing a read operation in said electronically alterable memory through said first data channel.

2. An electronically programmable memory module, comprising in combination:

a semiconductor substrate;

an electronically alterable memory device formed in said semiconductor substrate;

a first data channel for coupling said memory device to a digital system in which said memory is a component part;

a second data channel formed in said substrate for coupling said memory device to a data input port that is accessible independently of said digital system;

aid second data channel including a communications interface, a controller, and a state switch controlled by said controller;

said communications interface coupling data from said data input port to said controller;

said controller switching said state switch to a first state in response to a data input at said data input port, and to a second state in the absence of a data input at said data input port;

said state switch, in said first state, coupling said memory device to said controller and, in said second state, coupling said memory device to said first data channel;

said controller executing a write operation in said electronically alterable memory device in accordance with input signals applied at said data input port of said second data channel so that said controller stores in said memory device data received from said communications interface independently of said digital system; and said controller executing a read operation in said electronically alterable memory through said first data channel.

3. An electronically programmable memory module as in claim 1, wherein said controller includes a microprocessor, a programmable data storage means, and an input/output logic apparatus.

4. An electronically programmable memory module as in claim 1, wherein said communications interface includes a wireless communication interface.

5. An electronically programmable memory module as in claim 3, wherein said communications interface includes a wireless communication interface.

6. An electronically programmable memory module as in claim 1, further including a plurality of pin sockets on said module for connection of an additional memory device to said module, means to couple at least one of said plurality pin sockets to said first channel, and means to couple at least one of said plurality of said pin sockets to said controller.

7. An electronically programmable memory module as in claim 3, further including a plurality of pin sockets on said module for connection of an additional memory device to said module, means to couple at least one of said plurality pin sockets to said first channel, and means to couple at least one of said plurality of said pin sockets to said controller.

8. An electronically programmable memory module as in claim 4, further including a plurality of pin sockets on said module for connection of an additional memory device to said module, means to couple at least one of said plurality pin sockets to said first channel, and means to couple at least one of said plurality of said pin sockets to said controller.

9. An electronically programmable memory module as in claim 5, further including a plurality of pin sockets on said module for connection of an additional memory device to said module, means to couple at least one of said plurality pin sockets to said first channel, and means to couple at least one of said plurality of said pin sockets to said controller.

10. An electronically programmable memory module as in claim 2, wherein said controller includes a microprocessor, a programmable data storage means, and an input/output logic apparatus.

11. An electronically programmable memory module as in claim 2, wherein said communications interface includes a wireless communication interface.

12. An electronically programmable memory module as in claim 2, further including a plurality of pin sockets on said module for connection of an additional memory device to said module, means to couple at least one of said plurality pin sockets to said first channel, and means to couple at least one of said plurality of said pin sockets to said controller.

13. An electronically programmable memory module as in claim 10, further including a plurality of pin sockets on said module for connection of an additional memory device to said module, means to couple at least one of said plurality pin sockets to said first channel, and means to couple at least one of said plurality of said pin sockets to said controller.

* * * * *